US005468991A

United States Patent [19]
Lee et al.

[11] Patent Number: 5,468,991
[45] Date of Patent: Nov. 21, 1995

[54] LEAD FRAME HAVING DUMMY LEADS

[75] Inventors: Joon K. Lee, Seoul; Hyeon J. Jeong, Inchon, both of Rep. of Korea

[73] Assignee: Samsung Electronics Co., Ltd., Suwon, Japan

[21] Appl. No.: 158,740

[22] Filed: Nov. 30, 1993

[30] Foreign Application Priority Data

Dec. 31, 1992 [KR] Rep. of Korea .................. 9227632

[51] Int. Cl.⁶ .......................... H01L 23/48; H01L 29/46; H01L 29/54
[52] U.S. Cl. .......................... 257/666; 257/675
[58] Field of Search ..................... 257/666, 676, 257/675

[56] References Cited

U.S. PATENT DOCUMENTS 5,150,194 9/1992 Brooks et al. ..................... 257/676
5,287,000 2/1994 Takahashi et al. ..................... 257/676
5,309,017 5/1994 Maruyama ..................... 257/666

Primary Examiner—Jerome Jackson
Assistant Examiner—S. V. Clark
Attorney, Agent, or Firm—Charles R. Donohoe; Stephen R. Whitt

[57] ABSTRACT

A lead frame for a semiconductor device used in a vertically surface-mounted package which has internal leads gathered on one side thereof includes separately formed dummy leads attached to a semiconductor chip on the opposite side of the lead frame to avoid an inconsistent inflow pressure of a molding material during a package molding process caused by gathering of the internal leads on only one side, thereby enhancing reliability of the semiconductor package. There is also no need to separately form a heat sink structure for eliminating heat of the semiconductor chip since the dummy leads function as the heat sink.

5 Claims, 2 Drawing Sheets

LEAD FRAME HAVING DUMMY LEADS

BACKGROUND OF THE INVENTION

1. Field of the Invention

The present invention relates to a lead frame for use in a semiconductor device, and more particularly to a lead frame for a semiconductor device capable of enhancing reliability of the semiconductor device, wherein dummy leads attached to a semiconductor chip are provided on one side of a vertically surface-mounted package lead frame opposite from operative inner leads, which is mainly utilized in a mounting method of a semiconductor chip such as a lead-on-chip (hereinafter referred to as LOC) and a chip-on-lead (hereinafter referred to as COL).

2. Background Information

Recent developments in the semiconductor technology have yielded increased semiconductor chip memory capacity, which involves increased numbers of I/O pins, fast signal processing speed, and high power consumption. This increases the need for a dense-packing mounting method. Depending on the trend toward achieving high packing density of the semiconductor chips, the number of leads on the lead frame is increased to shorten the lead spacing and reduce the size of the leads. Therefore, it is difficult to design and manufacture a lead frame with the consequence of requiring continuous changes in the type of semiconductor packages and its manufacturing process and method.

Moreover, because of the high-speed signal processing and increased power dissipation, a large amount of heat is generated from the semiconductor chip. In order to eliminate this heat, a heat sink composed of a material having an excellent thermal diffusion property is usually separately installed in the semiconductor package. In the alternative, the envelope of the semiconductor package is formed of a material having an excellent thermal conductivity.

Additionally, in order to increase the mounting density of the semiconductor chip within an individual unit area, a chip-on-board (COB) method for directly mounting the semiconductor chip on a printed circuit board or stacked package method is currently available. Methods for mounting semiconductor packages have also become increasingly important.

A widely used semiconductor package type is a molding package which is obtained by mounting a semiconductor chip on a die pad of a general lead frame and then forming the envelope of the package using a molding material. This molding package may be classified into a horizontal-type and a vertical-type.

The horizontal-type package which is employed in memory cards and small or thin film-type devices in a personal computer, etc., includes, according to the shape of the packages, a single-in-line package (SIP) having leads projecting on only one side of the package envelope, a dual-in-line package (DIP) having leads projecting on both sides of the envelope, or a quad-flat package (QFP) having leads projecting on all four sides of the envelope.

Meanwhile, the vertical-type package is becoming more common in view of its light weight, large capacity and high speed of the semiconductor device when miniaturization of a substrate is contrived by utilizing an empty space of the substrate having components of different heights, or large amounts of general-purpose memory packages are installed in the major part of a main storage.

In such a vertical-type package, a zigzag-in-line in-line package (ZIP), having leads projecting on one side of the envelope of the package and then inserted into the substrate by being bent in both directions, creates difficulties in multilayer interconnection and an overall reflow on the substrate during a mounting process on both sides of the substrate.

A vertical surface-mount package (hereinafter referred to as a VSMP) 10 shown in FIG. 1 is devised to solve the above-described problem. Here, external leads 11 are bent while projecting on only one side of an envelope 13 of the semiconductor package, and the VSMP 10 is vertically mounted by means of support leads 12 bent in right angled shape in both direction and provided outside of the external leads 11.

As shown in FIG. 2, a plurality of VSMPs can be mounted on a printed circuit board 14, and the multilayer interconnection of the printed circuit board 14 can be attained because the packages are surface-mounted. Furthermore, it is possible to mount the packages on both sides of the printed circuit board 14 and perform an overall reflow of the external leads 11 together with other components.

Since the size of the mounted semiconductor chip is generally small in the above-described VSMPs, a semiconductor chip having a bonding pad around the chip periphery is mounted on a die pad, and a semiconductor chip having a bonding pad concentrated on the center thereof is mounted by means of the COL or LOC method.

One example of the conventional vertically surface-mounted package 15 having such a semiconductor chip is shown in FIG. 3. Here, a semiconductor chip 16 has a plurality of bonding pads on its center, and a plurality of internal leads 17 are regularly spaced on the upper portion of the semiconductor chip 16 while being arranged toward the upper and lower directions of the semiconductor chip 16. A plurality of wires 18 respectively connect the bonding pads formed on the semiconductor chip 16 to the internal leads 17. A reference numeral 19 designates a protective envelope of the semiconductor package for encapsulating the internal leads 17 and the semiconductor chip 16. A plurality of external leads 20 project outwardly on one side of the envelope 19 of the package. Support leads 21 of an open square shape bent in opposite directions are installed for supporting the vertically surface-mounted package 15 outside of the external leads 20. This vertically surface-mounted package 15 has a relatively small semiconductor chip 16, but the internal leads are difficult to form on the upper portion of the semiconductor chip to increase the memory capacity of the semiconductor chip.

FIG. 4 shows another example of the conventional vertically surface-mounted package, wherein semiconductor chip 23 is larger than that shown in FIG. 3. Because the cavity within the semiconductor package 22 is narrow, internal leads 24 attached on the semiconductor chip 23 are arranged generally in the direction of the projecting external leads 25. This type of the vertically surface-mounted package is illustrated in U.S. Pat. No. 4,951,122.

In the lead frame of the above-described vertically surface-mounted package, the semiconductor chip having bonding pads on its center is attached and then molded to the internal leads by means of the COL or LOC method.

At this time, since the internal leads are arranged in the direction of the external leads, all leads are gathered in only one side. Therefore, during a molding process, inflow pressure of a molding resin into the cavity is inconsistent between the side with the leads and the side without, and can cause deformation of the internal leads and wires. This results in short circuits or line disconnection, thereby degrading reliability of the semiconductor package.

SUMMARY OF THE INVENTION

Therefore, it is an object of the present invention to provide a lead frame for a semiconductor device capable of enhancing reliability of a vertical surface-mount semiconductor package by preventing deformation of internal leads and wires caused by inconsistent inflow pressure of a molding resin during a molding process.

To achieve the above object of the present invention, a lead frame for a semiconductor device is provided having at least one support lead for supporting an envelope of a semiconductor package and a plurality of external leads arranged in the same direction as the support lead. The lead frame also includes a plurality of internal leads extending from the plurality of external leads to the central portion of the lead frame, and a plurality of dummy leads arranged at regular intervals opposite to the plurality of internal leads, relative to the central portion of the lead frame as a reference. A side bar supports the plurality of dummy leads, while support bars support the plurality of internal leads and side bar. In addition, a plurality of bonding pads on the central portion of the semiconductor chip mount the semiconductor chip on the upper portion of the internal leads and dummy leads to allow wire-bonding the semiconductor chip to the internal leads.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1:
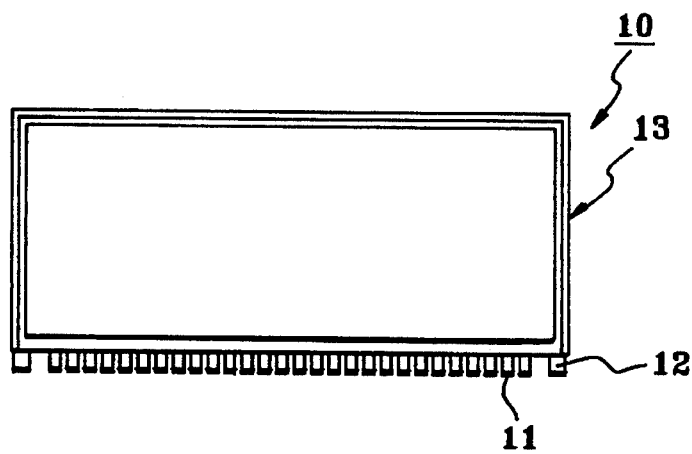
FIG. 1 is a plan view showing a general vertical surface-mount semiconductor package.
Figure 2:
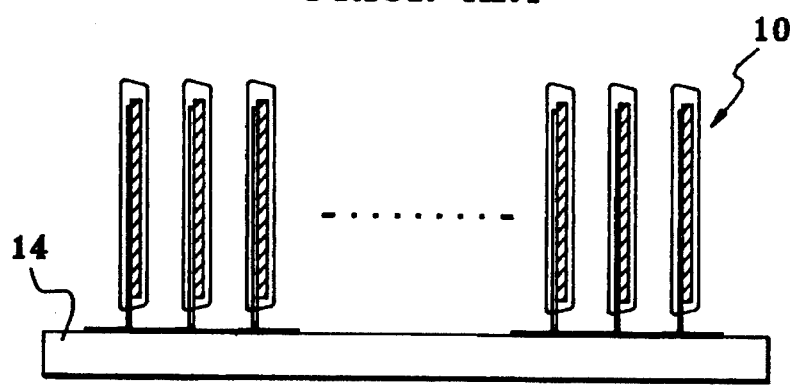
FIG. 2 is a side view of a plurality of vertical surface-mount semiconductor package according to FIG. 1 mounted on a printed circuit board.
Figure 3:
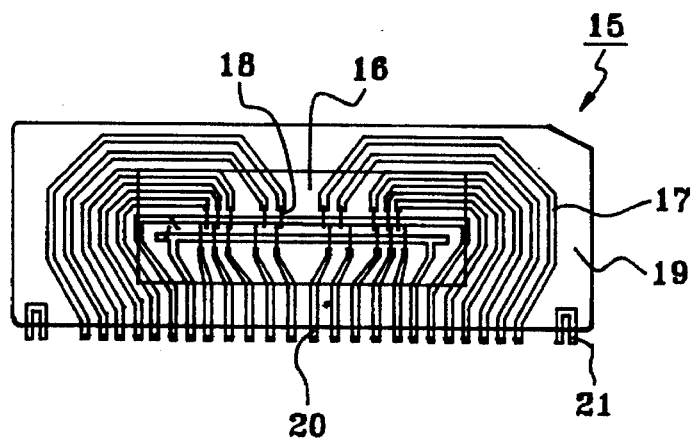
FIG. 3 is a plan view of a vertically surface-mounted package showing one example of a conventional lead frame for a semiconductor device.
Figure 4:
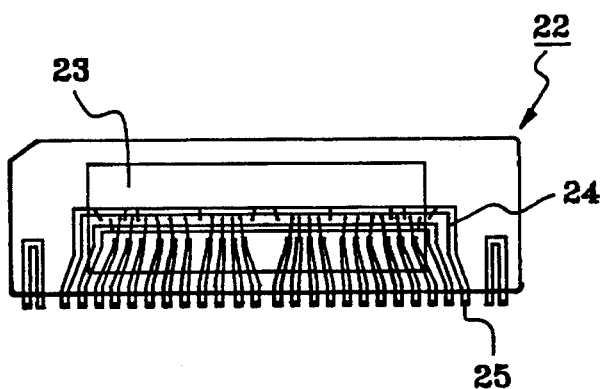
FIG. 4 is a plan view of the vertically surface-mounted package showing another example of the conventional lead frame for a semiconductor device.
Figure 5:
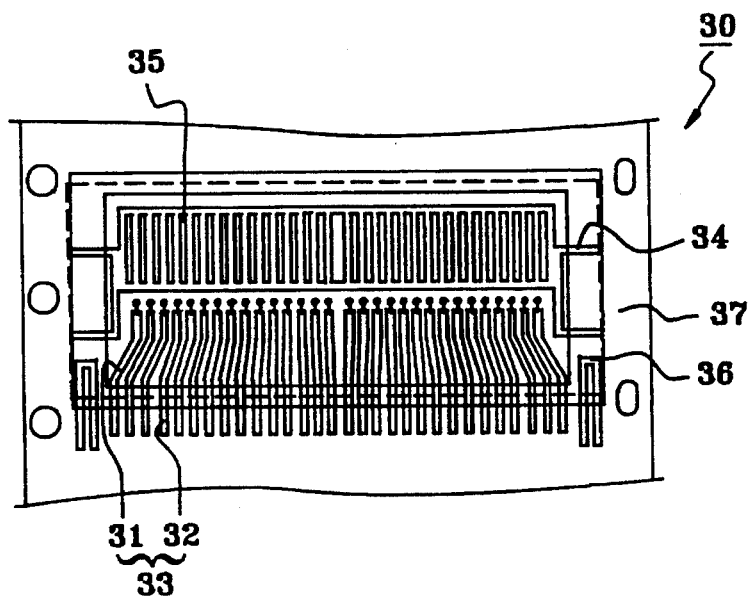
FIG. 5 is a plan view of a vertically surface-mounted package showing one embodiment of a lead frame for a semiconductor device according to the present invention.
Figure 6:
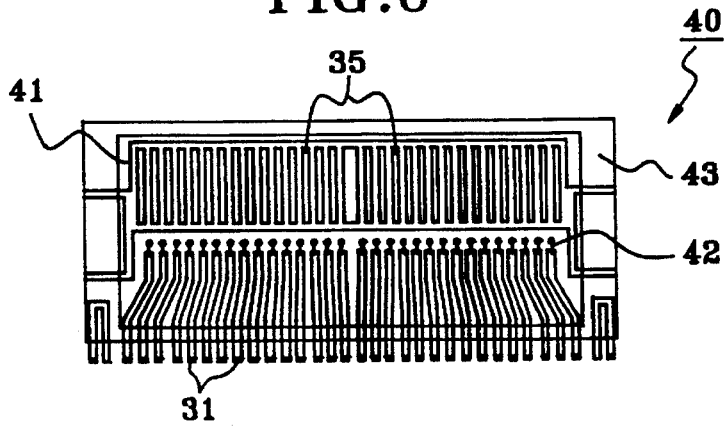
FIG. 6 is a plan view of the vertically surface-mounted package showing a semiconductor chip mounted on the lead frame for the semiconductor device shown in FIG. 5.

FIG. 5 shows a lead frame 30 for a semiconductor device according to the present invention. FIG. 6 shows a semiconductor package 40 using the lead frame 30 shown in FIG. 5.

Referring to FIG. 5, leads 33 consisting of regularly spaced internal and external leads 31 and 32 are arranged on one side of the lead frame 30. Dummy leads 35 supported by support bars 34 are formed on the other side of the lead frame 30. Support leads 36, which are longer than the leads 33, are formed for vertically mounting the semiconductor package 40 on the outer edges of the leads 33. All of these components are connected to a side bar 37, thereby forming the lead frame 30. The dummy leads 35 may be formed by simply modifying the support bar 34.

A semiconductor device using the foregoing lead frame will be described hereinbelow.

A semiconductor chip 41 having bonding pads at its center is attached on the lower portion of the dummy leads 35 and internal leads 31. The bonding pads and internal leads 31 are connected by means of wires 42. Then, an envelope 43 of the semiconductor package is formed by means of a molding material such as an ordinary epoxy molding compound to protect the semiconductor chip 41, internal leads 31, dummy leads 35 and wires 42. Since the dummy leads 35 are formed opposite the internal leads 31, the inflow pressure of the molding material is uniform, thereby avoiding the deformation of the internal leads 31 and wires 42. After removing the side bar 37 and a contact bar (not shown), the external leads 32 projecting on one side of the envelope 43 of the semiconductor package are bent in one direction prior to a surface mounting step, and the support leads 36 are respectively bent as an open square shape in opposite directions, thereby completing the vertically surface-mounted package 40.

Although the vertically surface-mounted package is formed by taking a state that the semiconductor chip is mounted on the lower side of the internal leads and dummy leads, it is obvious that the semiconductor chip may be mounted on the upper side of the internal leads and dummy leads.

According to the present invention as described above, dummy leads attached to a semiconductor chip are separately formed on one side of the lead frame for semiconductor device used in a vertically surface-mounted package which has internal leads gathered on the other side thereof. In addition, this semiconductor device structure may be applied to a flat packaging of a small outline J-lead package type.

Therefore, the vertically surface-mounted package according to the present invention is advantageous in that inconsistent inflow pressure of a molding material during a package molding process can be prevented to thereby enhance the reliability of the semiconductor package by avoiding damage caused thereby. Furthermore, the dummy leads function as a heat sink for eliminating heat from the semiconductor chip, so that there is no need to separately form a heat sink structure.

As the lead frame for the semiconductor device according to the present invention allows the semiconductor chip to be mounted either on the upper or lower sides of the internal leads and dummy leads, it will be understood by those skilled in the art that various changes in form and details may be effected herein without departing from the spirit and scope of the invention as defined by the appended claims.

What is claimed is:

1. A semiconductor chip package having a lead frame having upper and lower sides and a semiconductor chip mounted thereon, said lead frame comprising:

(a) a plurality of connection leads formed on a first side of said lead frame, each said connection lead comprising inner and outer portions, said connection leads being electrically connected to said semiconductor chip; and (b) a plurality of dummy leads formed on a second side of said lead frame opposite said first side, and functioning as a heat sink for eliminating heat from said semiconductor chip.

2. A semiconductor chip package as claimed in claim 1, further comprising a package body encapsulating said semiconductor chip and said inner portion of said connection leads.

3. A semiconductor chip package according to claim 1, wherein said semiconductor chip package is a small outline J-lead package type.

4. A semiconductor chip package according to claim 1, wherein said semiconductor chip package is a vertical surface mount type package.

5. The semiconductor chip package of claim 1, further comprising:

a reference line extending across said lead frame, said first and second sides being separated from one another by said reference line.

* * * * *